United States Patent [19]

Nishizawa et al.

[11] Patent Number: 4,644,386
[45] Date of Patent: Feb. 17, 1987

[54] INTEGRATED CIRCUIT EMPLOYING INSULATED GATE ELECTROSTATIC INDUCTION TRANSISTOR

[75] Inventors: Junichi Nishizawa; Tadahiro Ohmi, both of Miyagi, Japan

[73] Assignee: Handotai Kenkyu Shinkokai, Japan

[21] Appl. No.: 509,008

[22] Filed: Jun. 29, 1983

[30] Foreign Application Priority Data

Jun. 29, 1982 [JP] Japan .................... 57-113709

[51] Int. Cl.$^4$ .................... H01L 29/78; H01L 27/02
[52] U.S. Cl. .................... 357/23.3; 357/23.4; 357/23.12; 357/23.6; 357/23.1; 357/44; 357/41
[58] Field of Search .................... 357/23.12, 23.4, 23.3, 357/23.6, 23.1, 22, 44, 41

[56] References Cited

U.S. PATENT DOCUMENTS 3,653,978  4/1972  Robinson et al. ............... 357/23.12
4,334,235  6/1982  Nishizawa ....................... 357/41

FOREIGN PATENT DOCUMENTS 56-32757  4/1981  Japan ............................ 357/23.3

OTHER PUBLICATIONS

Schottky MOSFET for VLSI, Koeneke et al., IEDM 1981 pp. 367-370.

Primary Examiner—Martin H. Edlow
Assistant Examiner—Terri M. Henn
Attorney, Agent, or Firm—Sughrue, Mion, Zinn, Macpeak and Seas

[57] ABSTRACT

An insulated gate electrostatic induction transistor and an integrated circuit employing such an insulating gate electrostatic induction transistor as a drive transistor. A highly resistive channel region is provided on a semiconductor substrate of higher conductivity. A highly doped source region is formed adjacent the channel region, and a gate electrode, separated from the channel region by a thin insulating layer, is formed above the channel region. The gate electrode has a high diffusion potential with respect to the source region. The depth of the highly doped source region is less than that of a distribution of carriers in an inversion layer formed under the gate electrode.

27 Claims, 18 Drawing Figures

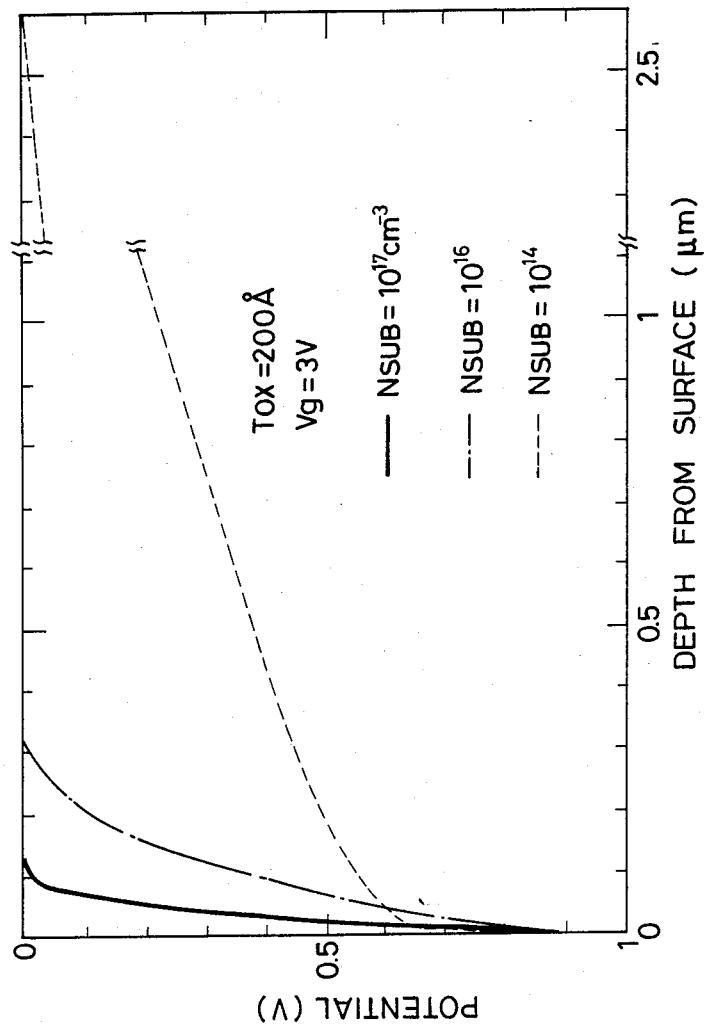

INTEGRATED CIRCUIT EMPLOYING INSULATED GATE ELECTROSTATIC INDUCTION TRANSISTOR

BACKGROUND OF THE INVENTION

The present invention relates to semiconductor integrated circuit devices employing insulated gate electrostatic induction transistors.

In the development of VLSI (Very Large Scale Integration) devices, insulated gate transistors (MOS transistors) and insulated gate field effect transistors (MOSFET) are typically used. A cross section of an n-channel MOSFET is shown in FIG. 1. The transistor structure includes a p-type substrate 11 having on one of its major surfaces n+ regions 12 and 13 which form a source region and a drain region, respectively. Between the source and drain regions is located a doped channel region 14, which is usually formed by injection of boron ions. The latter region has a higher impurity concentration than the substrate 11. The other elements of the device include a channel stop region 15, a gate insulating layer 16 made of $SiO_2$, $Si_3N_4$ or $SiO_xN_y$, a gate electrode 17 made of n+ polycrystalline silicon, $MoSi_2$, $WSi_2$, Mo or W, a field oxide region 18, a PSG layer 19, a metal source electrode 20 and a metal drain electrode 21.

To further improve the performance of the MOSFET and achieve higher packaging density, the effective channel length $L_{eff}$ of the device must be reduced. The method currently used to reduce the channel length generally depends on the scaling theory described in R. H. Dennard, F. H. Gaensslen, H. N. Yu, V. L. Rideout, E. Bassaous and A. R. Leblanc, "Design of Ion Implanted MOSFET's with Very Small Physical Dimensions", *IEEE, J. Solid State Circuits*, vol. SC-9, pp. 256–268, 1974. According to this theory, if the channel length $L_{eff}$ is to be reduced by a factor of 1/K, other parameters of the transistors are correspondingly changed as shown in Table 1.

TABLE 1

| Parameter | Scale factor |
|---|---|
| device dimensions ($T_{ox}$, $L_{eff}$, W) | 1/K |
| channel impurity concentration (N) | K |
| breakdown voltage (V) | 1/K |
| current capacity (I) | 1/K |
| capacitance (C = $\epsilon_{ox}S/T_{ox}$) | 1/K |
| propagation delay time ($t_p \alpha C \cdot V/I$) | 1/K |
| power consumption (p $\alpha$ V · I) | $1/K^2$ |
| speed power product (p · $t_p$) | $1/K^3$ |
| power density (VI/S) | 1 |
| wiring resistance ($R_L = \rho/Wt$) | K |
| wiring voltage drop ratio ($IR_e/V$) | K |
| wiring time constant ($R_eC$) | 1 |
| wiring current density ($I/W_t$) | K |

In table 1, $T_{ox}$ is the thickness of the gate oxide (gate insulating layer), $L_{eff}$ is the effective channel length, W is the channel width, $\epsilon_{ox}$ is the dielectric constant of the gate insulating layer, $S = L_{eff}W$, t is the thickness of the gate electrode, and $R_e$ is the thickness of the gate electrode.

As indicated in Table 1, the gate insulating layer thickness $T_{ox}$, channel width W, breakdown voltage V and current capacity I are all reduced by factors of 1/K, whereas the channel impurity concentration N is increased by a factor of K. However, in an actual circuit construction, reducing the breakdown voltage V by a factor of 1/K is difficult and it must, as a practical matter, have a value substantially larger than what this criterion would indicate. As a result, the impurity concentration of the channel assumes a value somewhere between K and $K^2$. This means N rapidly increases as the length of the channel is decreased. If the channel length $L_{eff}$ is made smaller than about 1 μm, N becomes far greater than $1 \times 10^{14}$ cm$^{-3}$ and approaches $1 \times 10^{17}$ cm$^{-3}$. A normally off MOSFET in which no current flows between the source and drain when the gate voltage is zero can be provided that characteristic only by providing the channel region with a neutral region which will not form a depletion layer. Due to this fact, any attempt at reducing the channel length unavoidably requires a corresponding increase in the concentration of impurities in the channel region.

As the impurity concentration of the channel is increased, the mobility of carriers is decreased (due to impurity scattering) and the current density is decreased. This can cause a drop in transconductance. In terms of electron mobility in the case of silicon, a mobility on the order of 1,500 cm$^2$/V sec at an impurity concentration of $1 \times 10^{14}$ cm$^{-3}$ is decreased to about 700 cm$^2$/V sec at a concentration of $1 \times 10^{17}$ cm$^{-3}$. If the channel impurity concentration is further increased, the carrier inversion layer formed beneath the gate insulating layer becomes very shallow and almost all carriers are subjected to scattering at interfaces between $SiO_2$ and Si or between $Si_3N_4$ and Si, causing an additional decrease in the effective mobility of carriers.

Three distribution curves of electron density in the direction of the depth of an inversion layer with 3 volts applied to a gate electrode formed on an oxide ($SiO_2$) film 200 Å thick on a p-type silicon substrate are shown in FIG. 2 for impurity concentrations of the substrate of $1 \times 10^{14}$ cm$^{-3}$, $1 \times 10^{16}$ cm$^{-3}$ and $1 \times 10^{17}$ cm$^{-3}$. The concentration at the surface is on the order of $2 \times 10^{19}$ cm$^{-3}$. For $N = 1 \times 10^{17}$ cm$^{-3}$, the electrons in the inversion layer are localized at a depth of about 100 Å, but when $N = 1 \times 10^{14}$ cm$^{-3}$, the electrons are distributed to 1,000 Å or deeper. Since the mean free path of carriers in silicon is between about 50 and 100 Å, almost all electrons in motion are subjected to surface scattering at $N = 1 \times 10^{17}$ cm$^{-3}$. When $N = 1 \times 10^{14}$ cm$^{-3}$, a substantial proportion of the electrons move in the bulk crystal without being subjected to surface scattering and, as a result, their effective mobility is increased.

Three distribution curves of potential in the direction of the depth of an inversion layer under the same conditions as those for FIG. 2 are shown in FIG. 3. As a matter of course, decreasing the impurity concentration of the substrate is accompanied by a deeper potential distribution in the substrate, which is equivalent to saying that the capacitance between the inversion layer and the substrate is reduced.

The dependency on the substrate impurity concentration of the concentration of electrons induced in an inversion layer for $T_{ox} = 200$ Å is shown in FIG. 4 for three gate voltages $V_g$ of 2, 3 and 5 volts. For the same gate voltage, the surface electron concentration increases as the substrate impurity concentration is decreased.

These results show that for the same gate voltage, more carriers are induced and their effective mobility is increased as the impurity concentration of the substrate is decreased. In other words, more drain current flows, increasing the transconductance of the device. As a further advantage, the input capacitance of the gate is decreased, thus enabling faster operation of the device. However, if the impurity concentration of the substrate is too low, a depletion layer is formed between the source and drain which permits a current to flow at $V_{GS}=O$, and hence the desired normally off characteristic cannot be obtained.

An insulated gate electrostatic induction transistor (MOSSIT) that provides a normally off characteristic without losing the advantages of high carrier mobility and small gate capacitance due to a channel region of low-impurity concentration has been proposed in Japanese Patent Application JPA 56-32757 and in an article by J. Nishizawa, T. Ohmi and H. L. Chen, "A Limitation of Channel Length in Dynamic Memories", *IEEE Trans. Electron Devices*, vol. ED-27, pp. 1640–1649, 1980. A cross section of such a MOSSIT is shown in FIG. 5. This device differs from the conventional MOSFET in three points: the $p^-$ substrate 31, $p^-$ channel region 32, and $p^+$ region 34 formed beneath the channel region. The impurity concentration of the $p^+$ region 34 is made low, for instance, not more than about $3-5\times10^{17}$ cm$^{-3}$, so that no tunnel current can flow between the region and the $N^+$ drain region 13 in the normal operating voltage range. In order to retain a high mobility, the $p^-$ region 32 usually has an impurity concentration of $1\times10^{15}$ cm$^{-3}$ or lower. The substrate has a low impurity concentation in order to decrease the capacitance of the source and drain regions. The gate region 33 is made of a material that provides the highest possible diffusion potential with respect to the $n^+$ source region, suitable examples of which are $p^+$ polycrystalline silicon, silicides such as MoSi$_2$, WSi$_2$, TiSi$_2$, and TaSi$_2$, and high melting point metals such as Mo, W and Pt. Alternatively, the part of the gate that contacts the gate insulating layer 16 may be made of $p^+$ polycrystalline silicon and the overlying part may be made of a silicide or a metal. This design reduces the resistance of the gate electrode and is more effective for high-speed operation of the device.

The conventional MOSFET very often uses a gate made of $n^+$ polycrystalline silicon, but this is not used in the MOSSIT of FIG. 5. If the gate 33 in the device of FIG. 5 were made of $n^+$ polycrystalline silicon, the resulting decrease in the thickness of the gate insulating layer 16 would bring the surface potential of the channel close to the source potential at $V_{GS}=O$. The resulting surface conduction would thus make it impossible to provide the desired normally off characteristic.

The MOSSIT of FIG. 5 is provided with a normally off characteristic not by any neutral area in the channel region, but by forming a potential barrier in the channel resulting from the diffusion potentials of the gate 33 and the $p^+$ region 34 with respect to the $n^+$ source region 12. Therefore, it is apparent that the MOSSIT of FIG. 5 uses a very different design concept that the conventional MOSFET.

Further, the device of FIG. 5 further includes a $p^+$ region 35 and an electrode 36 on the other major surface of the substrate. This is for the purpose of keeping the potential of the highly resistive substrate at a constant level. Yet further, the MOSSIT does not use a substrate bias of the type that is frequently employed with a conventional MOSFET. More specifically, the substrate of the n-channel MOSSIT of FIG. 5 is not negatively biased. With a negative bias applied to the substrate, more of the electrons induced in the channel from the inversion layer are localized in the surface. As shown in FIG. 2, the basic philosophy of the MOSSIT is to permit the induced carriers to flow all the way through to the deepest area, and it is for this reason that the substrate is not given a negative bias. To the contrary, the substrate is forwardly biased to the extent permitted by the diffusion potential.

Because of the low impurity concentration of the channel region, the MOSSIT of FIG. 5 has a high carrier mobility, permitting a flow of a large drain current. However, in order to provide a potential barrier of 0.6 volts at a drain voltage of 3 volts when the substrate and gate are biased to the same potential as the source, the relation $L_{eff}/D > 1.6$ must be satisfied. In other words, the effective channel length $L_{eff}$ must be at least 1.6 times as large as the depth of the channel region D. Needless to say, with a lower voltage, the critical value of $L_{eff}/D$ can be reduced to 1.5, but in no case should $L_{eff}/D$ be lower than 1.3.

In view of the above considerations, one object of the present invention is to provide a MOSSIT that achieves a higher transconductance with a shorter channel and which performs consistently irrespective of variations in the fabrication process.

Another object of the present invention is to provide an integrated circuit using this MOSSIT.

SUMMARY OF THE INVENTION

In accordance with these and other objects of the invention, there is provided an insulated gate electrostatic induction transistor including a semiconductor substrate, a highly resistive channel region, a highly doped source region formed adjacent the channel region, and a gate electrode disposed adjacent the highly resistive channel region and separated therefrom by a thin insulating layer with the gate electrode having a high diffusion potential with respect to the source region and with the depth of the highly doped region being less than that of a distribution of carriers in an inversion layer formed under the gate electrode. For example, the depth of the source region may be of the order of several hundred angstroms or less. Preferably, the depth of the channel region is approximately equal to or smaller than the effective channel length of the channel. The gate electrode may be made of polycrystalline silicon, a silicide such as MoSi$_2$ WSi$_2$, TaSi$_2$ or TiSi$_2$, or a high-melting point metal such as Mo, W or Pt, or possibly even Al. The portion of the gate electrode in contact with the gate insulating layer should be made of a low-resistivity polycrystalline of a conductivity type opposite of that of the source region. This transistor may be employed advantageously in an integrated circuit as a driver transistor.

BRIEF DESCRIPTION OF THE DRAWINGS

FIG. 3 is a graph showing the dependency on the substrate impurity concentration of a potential distribution in the presence of an inversion layer;

DESCRIPTION OF THE PREFERRED EMBODIMENTS

Figure 5:
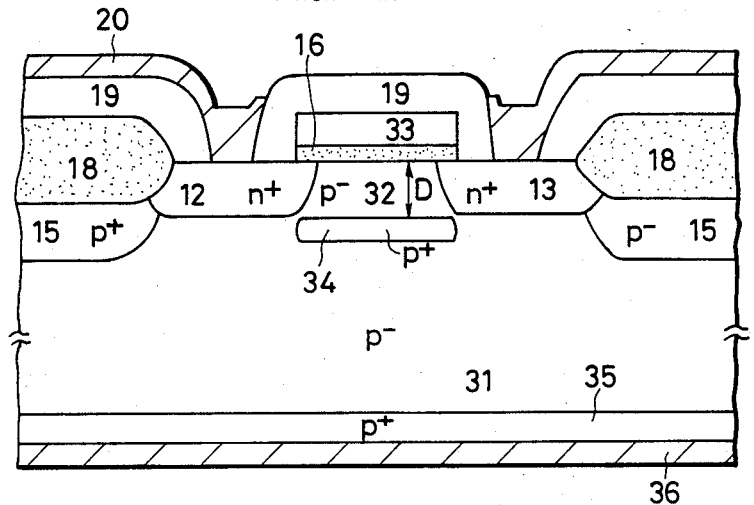
FIG. 5 is a cross-sectional view of a conventional n-channel MOSSIT.

As mentioned above, $L_{eff}/D$ for the MOSSIT of FIG. 5 cannot assume a very small value if the device requires a normally off characteristic. The primary reason for this is that the depth of the n+ source and drain regions is equal to or greater than the depth of the channel region. The n+ source region is normally held at 0 volts while the n+ drain region is at a nonzero voltage $V_d$. Thus, the smaller $L_{eff}$, the greater will be the effect of these voltages on what occurs in the interior of the channel, and as a result, the lower will be the potential barrier. However, theoretically the source and drain regions need not be as deep as in the device of FIG. 5 since the sole purpose of the source region is to supply charge carriers at an adequate rate to the channel region and the purpose of the drain region is to collect charge carriers from the channel region at substantially the same rate.

Figure 6:
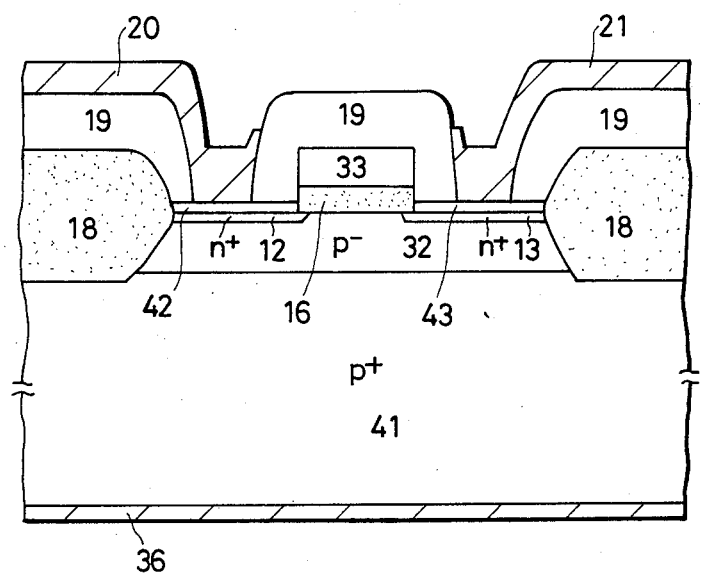
FIGS. 6 and 7 show in cross section two embodiments of an n-channel MOSSIT of the present invention.

A cross section of an n-channel MOSSIT of the present invention is shown in FIG. 6. In this embodiment, the MOSSIT is formed on a p+ substrate 41 overlaid with a p− channel layer 32 formed, for example, using a known epitaxial growth technique. On the layer 32, a very thin n+ source region 12 and n+ drain region 13 are formed, the thicknesses of which are of the order of several hundred angstroms or less. The n+ regions 12 and 13 are overlaid with silicide (MoSi$_2$ or WSi$_2$) layers 42 and 43, respectively. The depth of the p− channel region 32 is approximately equal to or smaller than the effective channel length $L_{eff}$. The p+ substrate 41 has an impurity concentration of about $1 \times 10^{17}$ cm$^{-3}$ or more. A sharp interface can be provided by self doping between the p− epitaxial layer 23 and the p+ substrate. It is desired that the substrate have a relatively high impurity concentration because, by so doing, the substrate potential is stabilized and the potential barrier in the channel increased in the non-conducting state. The impurity concentration of the p− channel is preferably set at about $1 \times 10^{15}$ cm$^{-3}$ or lower. The gate electrode 33 is made of p+ polycrystalline silicon, a silicide such as MoSi$_2$, WSi$_2$, TaSi$_2$ or TiSi$_2$, or a high-melting point metal such as Mo, W or Pt. If every step of the fabrication of the device can be performed at 500° C. or below, the gate electrode may be made of Al. To minimize the channel length, the part of the gate electrode in contact with gate insulating layer 16 is desirably made of low-resistivity polycrystalline silicon of a conductivity type opposite to that of the source region, with a silicide or metal layer being formed in that area. This is for the purpose of ensuring the provision of a normally off characteristic and reducing the gate resistance.

The thickness of the silicide layers 42 and 43 should be not more than several hundred angstroms. These layers can be made by the following procedure. A molybdenum layer not thicker than 100 Å is deposited by vacuum evaporation or chemical vapor deposition (CVD). Then, ions of an impurity such as As are injected into the Mo film in such a manner that As atoms penetrate through the film to a point several tens of angstroms to several hundred angstroms below the surface of the silicon. For a Mo layer having a thickness of about 100 Å, an acceleration voltage of about 100 kV is sufficient for the injection of As. Subsequently, the Mo layer is heated to a temperature between about 600° and 700° C., whereupon the Mo reacts with silicon to form MoSi$_2$. Since a highly doped ($1 \times 10^{20}$ to $1 \times 10^{21}$ cm$^{-3}$) As layer is present adjacent the MoSi$_2$ layer, the As can be activated by annealing at a temperature of about 900° to 1,000° C. The MoSi$_2$ layer thus formed is very stable. Its homogeneity is not lost by the annealing step. As a result, a MOSSIT having the structure shown in FIG. 6 can be fabricated with good reliability.

In the MOSSIT of the present invention shown in FIG. 6, the source and drain regions are formed as very thin layers so that they will not contact the p+ material of the substrate. With this structure, the impurity concentration of the p+ substrate can be increased without producing an appreciable tunnel current or lowering the breakdown voltage. Because the source and drain regions are far removed from the p+ substrate, their capacitances are reduced to a very small level. To construct a device of the type shown in FIG. 5, a masking step is necessary for forming the p+ region 34, but this is not necessary for fabricating the device of FIG. 6. Moreover, the MOSSIT of the present invention has a very short, high-resistivity channel that provides a higher carrier mobility and permits carriers in the inversion layer to flow to an appreciably deep area. As a result, the device has a higher transconductance and smaller source and drain capacitances than prior art approaches, and hence is more suitable for high-speed operation. In addition, the device has an increased drain breakdown voltage because the n+ drain region makes no direct contact with the p+ region and the effect of the drain voltage is distributed generally throughout the channel region. In the conventional MOSFET, the effect of the drain voltage is localized in the part of the channel on the drain side, but in the MOSSIT of the present invention, the effect of the drain voltage reaches the inside of the channel so that the intensity of the resulting electric field is low enough to minimize variations in the threshold voltage due to the injection of hot electrons.

Figure 7:
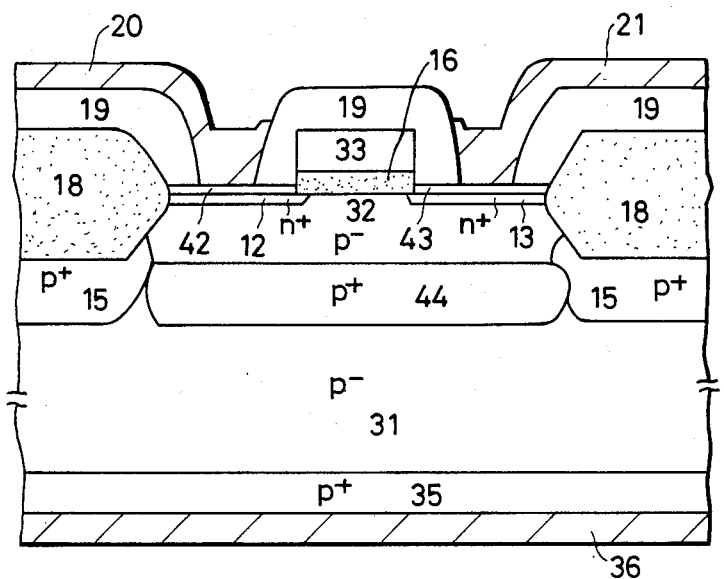

The MOSSIT of FIG. 6 has a p− layer on the p+ substrate. Another embodiment of the device of the present invention wherein a p+ buried layer is formed on the p− substrate by ion implantation is shown in FIG. 7. The structure of the MOSSIT shown in FIG. 7 is basically the same as that of FIG. 6 except that a p+ diffusion region is formed on the backside of a p− substrate 31 which is overlaid with a p+ substrate 44 by ion injection. The device of FIG. 7 requires no epitaxial growth steps and hence can be fabricated more easily than the device of FIG. 6. It should be noted, however, that when the p+ region 44 is implanted with boron ions and annealed, redistribution of boron ions will occur, and a sharp difference in the distribution of impurities at the p+/p− interface will thus not be provided. This problem can be avoided by implanting ions of an impurity such as As in an amount sufficient to compensate for the boron ions at the interface.

Figure 2:
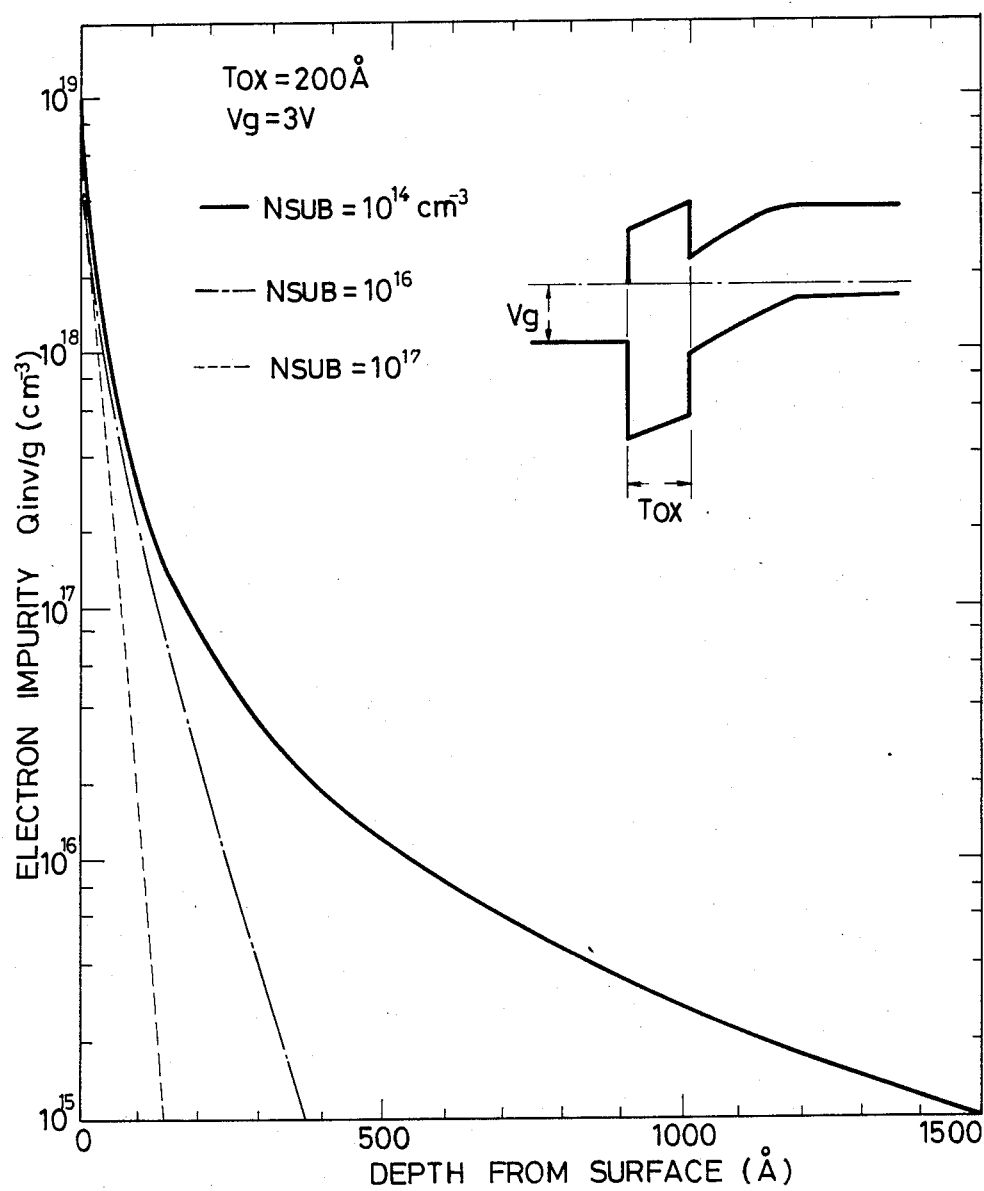
FIG. 2 is a graph showing the dependency on the substrate impurity concentration of the concentration of impurities distributed in an inversion layer.

As shown in FIG. 2, a very high concentration ($1 \times 10^{13}$ to $1 \times 10^{16}$ cm$^{-3}$) of carriers is induced in the inversion layer directly under the gate insulating layer of a MOS transistor. In spite of this, the resistance of this space charge has no immediate effect on the transistor because, at low drain voltage almost all of the electric field lines originating on the carriers induced in the channel end on the gate electrode. As a consequence, there is no substantial space charge effect due to the carriers in the channel between the source and drain, the two primary electrodes of the transistor. However, if the drain voltage is increased to some extent, some of the electric field lines originating on the carriers in the channel on the drain side end at the drain. When the drain voltage V reaches $V_g - V_{th}$ ($V_g$=gate voltage, $V_{th}$=threshold voltage), all of the electric field lines emanating from the carriers in the channel on the drain side end at the drain, and consequently, the resistance of the space charge present in the channel becomes significant. This is one of the causes of current saturation occurring in the conventional MOSFET.

Most simply, the current-voltage characteristics of the conventional MOSFET are given by the following relations:

$$I_d = \beta \left[ (V_g - V_{th})V_d - \frac{V_d^2}{2} \right], \text{ for } V_d \leq V_g - V_{th}; \quad (1)$$

and $$I_d = (\beta/2)(V_g - V_{th})^2, \text{ for } V_d > V_g - V_{th} \quad (2)$$

In either case, $$\beta = \frac{\mu_c \epsilon_{ox} W}{T_{ox} \cdot L_{eff}}, \quad (3)$$

where $\mu$ is the effective mobility of the carriers.

From formula (1), the resistance $R_{FET}$ in a near-equilibrium state at a small drain voltage is:

$$R_{FET} = \frac{1}{\beta(V_g - V_{th})} = \frac{T_{ox} \cdot L_{eff}}{\mu_c \epsilon_{ox} W(V_g - V_{th})}. \quad (4)$$

On the other hand, the drain voltage, particularly when it is high, has a substantial effect on the interior of the channel of a MOSSIT because it is strongly affected by the resistance of the space charge induced in the channel. Assuming that all of the electric field lines of the carriers in the channel end at the drain, the resistance $R_{sc}$ of the space charge to a first approximation is:

$$R_{sc} \simeq \frac{L_{eff}^2}{2\epsilon S V_s} \quad (5)$$

where $\epsilon$ is the dielectric constant of silicon and S is the cross-sectional area of the region through which the change carriers flow. In this first approximation, for simplicity, all carriers are assumed to move at a saturated velocity $V_s$. The electric field lines of a majority of the carriers end at the gate of a MOSSIT when the drain voltage is low, and even if the drain voltage is significantly high, many electric lines still end at the gate. Formula (5) holds good on the condition that the electric field lines of the carriers in the entire channel region end on the drain electrode, but this condition is rather extreme and the value of $R_{sc}$ calculated from formula (5) is thus generally higher than in actuality. In the case where $V_s = 1 \times 10^7$ cm/sec, $\mu_c = 600$ cm$^2$/V sec, $T_{ox} = 200$ Å, $V_g - V_{th} = 2$ V, the effective channel depth=0.15 $\mu$m and W=1 $\mu$m, $R_{FET}$ and $R_{sc}$ have the following values for different values of $L_{eff}$:

TABLE 2

| $L_{eff}$ | $R_{FET}$ | $R_{sc}$ |
|---|---|---|
| 1 $\mu$m | $4.7 \times 10^5$ Ω | $3.17 \times 10^5$ Ω |
| 0.5 $\mu$m | $2.35 \times 10^5$ Ω | $8 \times 10^4$ Ω |
| 0.5 $\mu$m | $1.4 \times 10^5$ Ω | $2.8 \times 10^4$ Ω |

In spite of the rather liberal estimation of $R_{sc}$, it is smaller than $R_{FET}$ when $L_{eff}$ is 1 $\mu$m or less. The data of Table 2 thus shows that, even if the effect of the drain voltage applied to a MOS transistor with a short channel covers a wide area of the channel and the effect of the resistance of the space charge is substantial, more drain current flows and a higher transconductance is achieved by providing a high-resistivity channel region and by increasing the carrier mobility so that the induced carrier are distributed over a wide area extending from the surface inwards.

$R_{sc}$ decreases with decreasing $L_{eff}$. Therefore, if the channel length is reduced to the minimum, the effect of $R_{sc}$ is virtually negligible. However, if the channel is relatively long and is sensitive to the effect of $R_{sc}$, the drain region should not be as shallow as in the embodiments of FIGS. 6 and 7 because the carriers' flow into the drain region in a very fine stream and may be seriously affected by $R_{sc}$. If $L_{eff}$ is about 1 $\mu$m, only the n+ drain region may be formed as a deep (about 0.1 to 0.2 $\mu$m, for instance) layer as an effective way to reduce $R_{sc}$. If $L_{eff}$ is about 1 $\mu$m, D (the depth of the channel region) may be about 0.5 to 0.8 $\mu$m, so there will be no direct contact between the n+ drain region and the substrate or buried p+ region. As a result, the device will not suffer substantial deterioration with respect to the drain breakdown voltage or the drain/source capacitance.

The MOSSITs of the present invention shown in FIGS. 6 and 7 can have either both source and drain regions or only the source region formed as relatively shallow areas (about 70 to several hundred angstroms), as a result of which they achieve a high drain breakdown voltage, small drain/source capacitance and make effective use of a short channel without being adversely affected by minor variations in fabrication processes.

Figure 8:
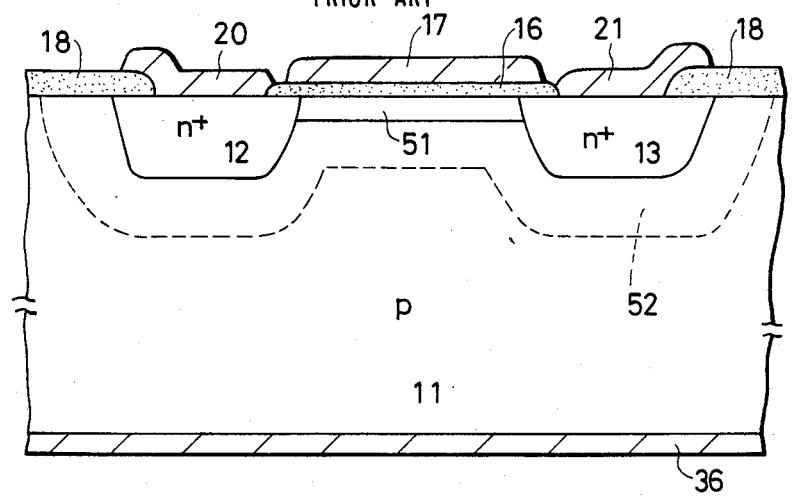
FIG. 8 is a schematic diagram showing the operational mode of a conventional MOS transistor.
Figure 9:
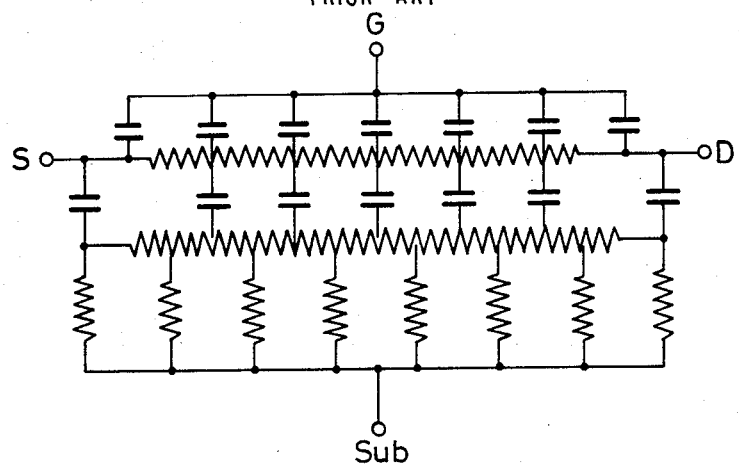
FIGS. 9 and 10 are equivalent circuits that approximate the conventional MOS transistor in the conducting state.

When the gate of a conventional MOSFET is biased with a voltage greater than the threshold value $V_{th}$, a channel is formed as shown schematically in FIG. 8 (assuming a very small drain voltage). In FIG. 8, the channel part of the resulting inversion layer where electrons are present is indicated by reference numeral 51, and the interface between the depletion layer and the neutral region is indicated by reference numeral 52. The depth of the depletion layer depends on the impurity concentration, and hence decreases with increasing impurity concentration. Impurity concentrations of the p-type substrate 11 of $1\times10^{14}$ cm$^{-3}$, $1\times10^{15}$ cm$^{-3}$, $1\times10^{16}$ cm$^{-3}$ and $1\times10^{17}$ cm$^{-3}$ correspond to depths of depletion layer under the gate of approximately 2.4 $\mu$m, 0.85 $\mu$m, 0.3 $\mu$m and 0.1 $\mu$m, respectively. An equivalent circuit of a MOS transistor having a channel formed in its surface, as shown in FIG. 8, can be approximated by an RC distributed constant circuit of a configuration shown in FIG. 9, wherein S, G, D and Sub represent source, gate, drain and substrate electrodes, respectively. The source is connected to the drain through the resistance of the channel, with a distributed capacitance being present between the channel and gate and both a distributed capacitance and distributed resistance being present between the channel and substrate. A capacitance is also present between the source and drain.

Figure 1:
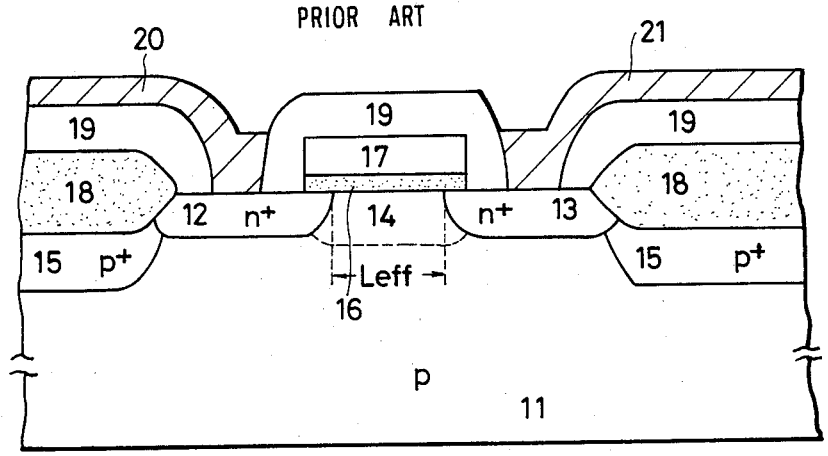
FIG. 1 is a cross-sectional view of a conventional MOSFET.
Figure 4:
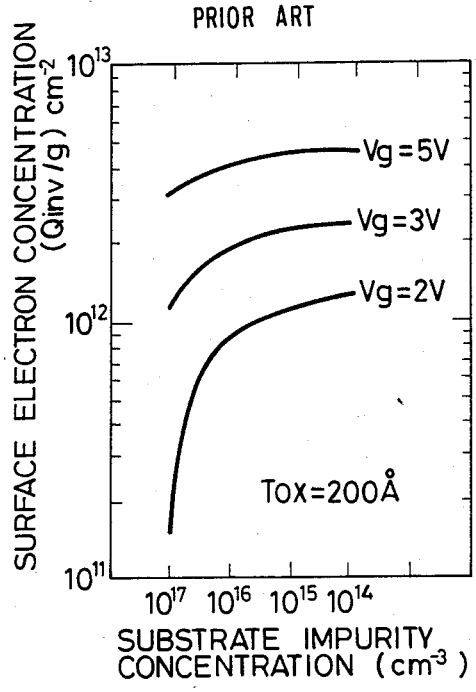
FIG. 4 is a graph showing the dependency on the substrate impurity concentration of the surface charge concentration of carriers induced in an area beneath the gate insulating layer.
Figure 10:
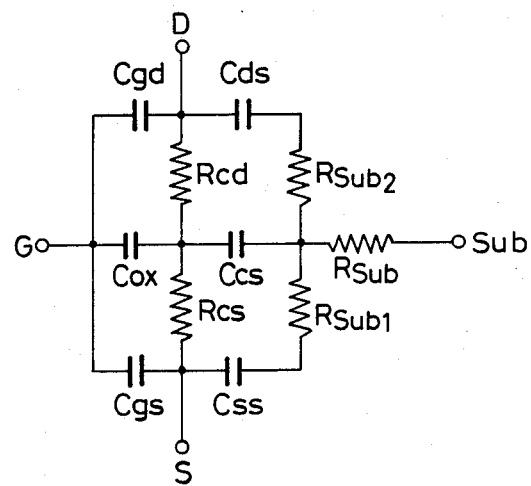

The equivalent circuit of the configuration of FIG. 1 is shown in more simplified form in FIG. 10. This diagram is not completely accurate, but it is a reasonable approximation of the elements around the channel. In FIG. 10, $R_{cs}$ and $R_{cd}$ are channel resistances on source and drain sides, respectively; $R_{sub1}$, $R_{sub2}$ and $R_{sub}$ are the substrate resistance on the source side, the substrate resistance on the drain side, and the channel-to-substrate resistance, respectively; $C_{ox}$, $G_{gs}$, $C_{gd}$, $C_{cs}$, $C_{ss}$ and $C_{ds}$ are a gate-to-channel capacitance, a gate-to-source capacitance, a gate-to-drain capacitance, a channel-to-substrate capacitance, a source-to-substrate capacitance, and a drain-to-substrate capacitance, respectively. In the conventional MOSFET, $C_{cs}$ and $C_{ds}$ vary with changes in the gate and drain voltages, and the rate of their variation can be a limiting factor on the device when it is operating at high speed. (See Nishizawa, Ohmi and Chen, "Reducing the Physical Dimensions and Increasing the Operating Speed of SITIC" in a technical bulletin of the Study Group of Electronic Devices, The Institute of Electrical Engineers of Japan, EDD-81-20, February 1981). If a highly conductive channel is formed and the values of $R_{cs}$ and $R_{cd}$ become small, the time constant is determined essentially by $C_{ox}R_{cs}$ and $C_{ox}R_{cd}$, but if no channel is formed and the device is in the nonconductive state, the time constant is determined by $$\frac{C_{ox} \cdot C_{cs}}{C_{ox} + C_{cs}}$$

and the resistance of the substrate. In the conventional MOSFET, the impurity concentration of the channel area is increased by channel doping, so that $C_{cs}$ has a high value. As a result, $$\frac{C_{ox} \cdot C_{cs}}{C_{ox} + C_{cs}}$$

is high.

Figure 11:
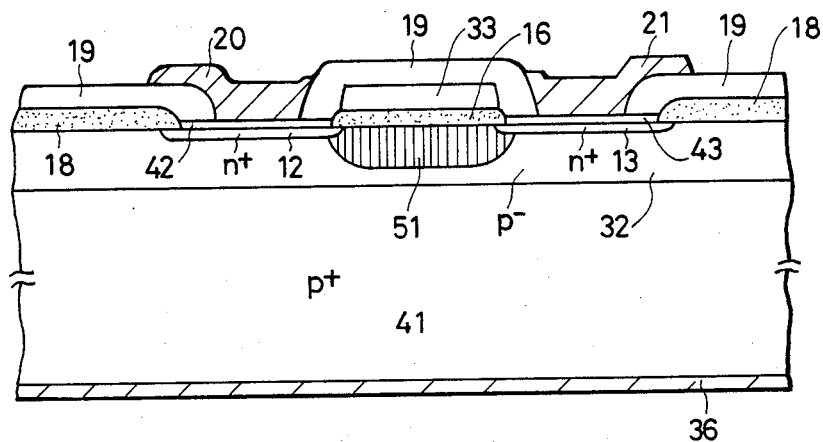
FIG. 11 is a schematic diagram showing a MOSSIT of the present invention in the conducting state.

When the gate of the MOSSIT of the present invention is biased with a potential higher than a threshold value $V_{th}$, a channel is formed as shown schematically in FIG. 11, wherein a p$^-$ epitaxial layer is formed on a p$^+$ substrate 41. By decreasing the impurity concentration of the p$^-$ layer to a relatively low level, one end of the depletion layer will always be in contact with the p$^+$ substrate 41, and hence there will be no reduction in the operating speed of the device if the width of the depletion layer varies.

An equivalent circuit of the MOSSIT of FIG. 11 in the conductive state can also be approximated by the circuit of FIG. 10, except that the values of $R_{cs}$, $R_{cd}$, $R_{sub1}$, $R_{sub2}$, $R_{sub}$, $C_{gs}$, $C_{gd}$ and $C_{cs}$ are smaller than the corresponding values for the conventional MOSFET. Therefore, the time constants for the MOSSIT for both conductive and nonconductive states are smaller than those for the MOSFET.

If the impurity concentration of each of the n$^+$ source and drain regions is $1\times10^{21}$ cm$^{-3}$, the impurity atoms will have an average interatomic distance of 10 Å. Therefore, if the source and the drain are each 100 Å deep, an average of ten impurity atoms are present in the direction of their depth. This enables the source and drain layers to function satisfactorily as n$^+$ regions. As a result, the depth of the high-resistivity channel can safely be reduced to 0.1 $\mu$m or less, and hence the effective length of the channel can be reduced to 0.1 $\mu$m or less. Furthermore, the transconductance is increased and the drain/source capacitance is decreased, enabling the device to operate at an even higher speed.

Figure 12:
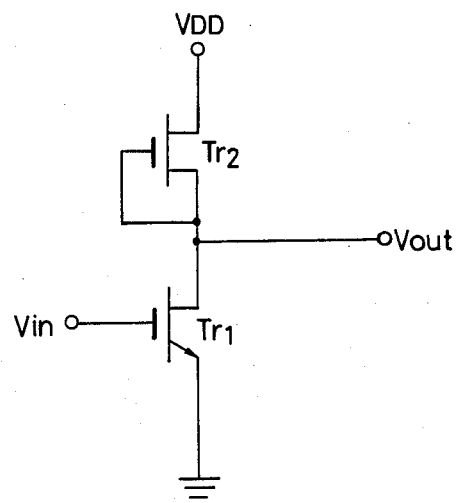
FIG. 12 is a circuit diagram of an E/D mode inverter using a MOSSIT of the present invention as a drive transistor.
Figure 13:
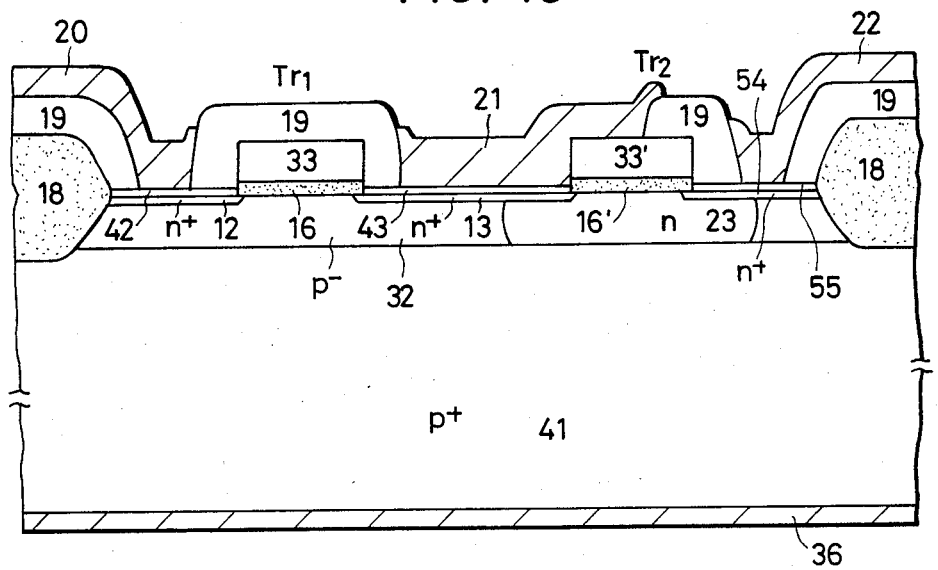
FIG. 13 is a cross-sectional view of an integrated circuit implementation of the inverter of FIG. 12.

As an obvious result of the features described above, an integrated circuit using the MOSSIT of the present invention has a large drive power and can operate at very high speed. An embodiment using the MOSSIT of the present invention as a drive transistor for an E/D mode inverter circuit is shown in FIGS. 12 and 13, wherein Tr$_1$ is the MOSSIT of the present invention and Tr$_2$ is a depletion mode load transistor. In FIG. 12, $V_{in}$, $V_{out}$ and $V_{DD}$ represent an input voltage, an output voltage and a supply voltage, respectively.

FIG. 13 shows a cross section of the E/D mode inverter of FIG. 12. The MOSSIT used in this embodiment is of the type illustrated in FIG. 6 wherein a p$^-$ layer is formed on a p$^+$ substrate. Needless to say, an MOSSIT of the type shown in FIG. 7 in which a buried p$^+$ layer is formed in a p$^-$ substrate by ion implantation may also be used. (In FIGS. 13 and 6, like reference numerals identify like elements.)

Further, reference numeral 22 denotes a metallic (Al or Al-Si) drain electrode for the load transistor; 23 an n-type ion-implanted region for enabling the transistor Tr$_2$ to operate as a depletion mode transistor, 16' and 33' are a gate insulating layer and a gate electrode corresponding to 12 and 13; and 55 is a thin silicide layer corresponding to 42 and 43. The impurity concentration of the n-type region 23 depends on the overall dimensions, but is preferably on the order of $1\times10^{16}$ to $1\times10^{17}$ cm$^{-3}$. The resistance of Tr$_3$ is set to a value equal to about one-tenth of the resistance of the transistor Tr$_1$ when it is conducting.

The MOSSIT of the present invention has a large transconductance and small gate and drain capacitances. These advantages are particularly evident in a circuit arrangement in which two MOSSITs of the invention are connected in a complementary arrangement. The power consumption of devices having a fast switching speed is especially low when they are connected in a complementary configuration due to the fact that they require energy only for charging and discharging capacitances at the time of switching. The amount of energy required is approximately given by the formula $CV_{DD}^2/2$, where $C=2C_d+2C_g+C_w$ ($C_d$=drain capacitance, $C_g$=gate capacitance, and $C_w$=wiring-associated capacitance). Moreover, transistors connected in a complementary arrangement have a sufficient noise margin that they can be operated from a low supply voltage. Still further, transistors so operated exhibit consistent performance in spite of variations in fabrication processes. The advantage resulting from reduced capacitance is therefore great.

Figure 14:
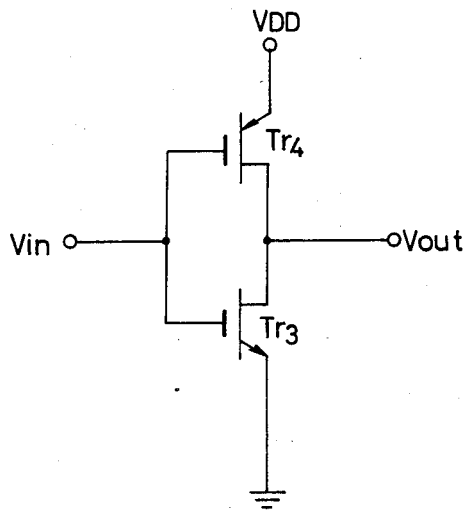
FIG. 14 is a circuit diagram showing two MOSSIT devices of the present invention connected in a complementary arrangement.
Figure 15:
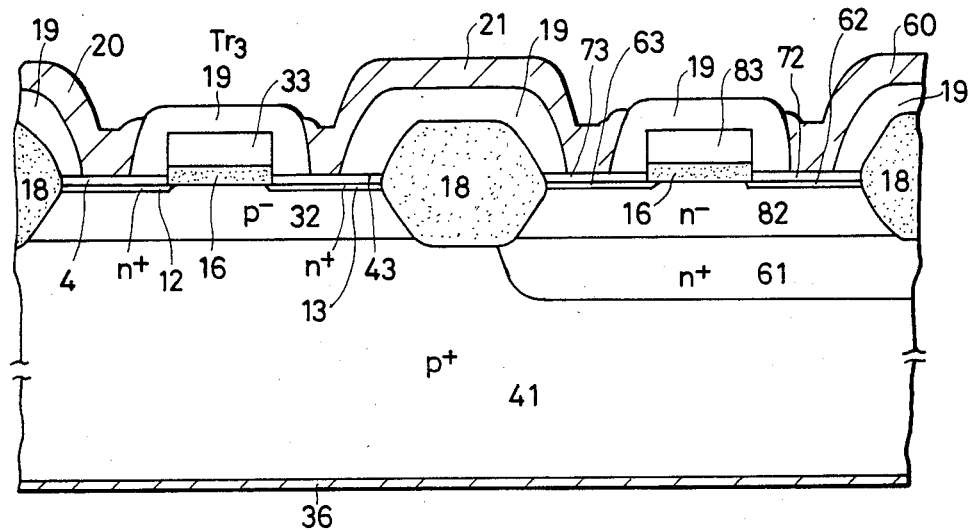
FIG. 15 is a cross-sectional view of an integrated circuit implementation of the circuit of FIG. 14.

A circuit in which two MOSSIT transistors of the present invention are connected in complementary form (CMOSSIT) is shown in FIG. 14, wherein Tr$_3$ and Tr$_4$ are an n-channel MOSSIT and a p-channel MOSSIT, respectively. An integrated circuit implementation of this CMOSSIT device is shown in FIG. 15. In this embodiment, the CMOSSIT is formed on a p+ substrate 41 which has a buried region 61 formed in a selected area by diffusion of As. The region 61 is overlaid with a grown high-resistivity layer. The p+ substrate 41 has an impurity concentration on the order of $1\times10^{17}$ cm$^{-3}$, whereas the n+ region 61 may be a diffusion layer having an impurity concentration on the order of $1\times10^{18}$ cm$^{-3}$. Reference numerals 60, 62, 63, 72, 73, 82 and 83 respectively represent the metallic source electrode, p+ source region, p+ drain region silicide source layer, silicide drain layer, n⁻ channel region and the gate electrode of the p-channel MOSSIT. The n⁻ region 82 has an impurity concentration of about $1\times10^{18}$ cm$^{-3}$ or less. The gate electrode 83 is made of n+ polycrystalline silicon, a silicide such as MoSi$_2$, WSi$_2$, TaSi$_2$ or TiSi$_2$, or a metal such as Mo, W, Pt or Al.

The most effective way to minimize the channel length is to form a gate electrode in such a manner that the part of the gate electrode in contact with the gate insulating layer is formed of n+ polycrystalline silicon, with a silicide or metallic layer formed thereabove. Generally, the p+ substrate 41 should be held equal in potential to the source 20 of the n-channel MOSSIT, and the n+ buried layer 61 should be at the same potential as that of the source 60 of the p-channel MOSSIT. It may be appreciated that a similar CMOSSIT circuit may be configured from transistors of the type shown in FIG. 7. For example, a p+ buried layer and an n+ buried layer can be formed in a p⁻ substrate in selected areas, and an n-channel MOSSIT and a p-channel MOSSIT formed on the respective buried layers. In the embodiment of FIG. 15, an isolation region 18 is provided between the n-channel MOSSIT and the p-channel MOSSIT, but this isolation region may be omitted.

As techniques for reducing the physical dimensions of individual devices become more sophisticated, more devices can be easily integrated on a single chip. To meet this demand for higher packaging density, complementary MOS (CMOS) transistors that can easily be designed to operate from a low voltage, and with a low power consumption, while providing a greater noise immunity and better ability to tolerate variations in the fabrication process, will be used more frequently due to their inherent advantages. Obviously, various logic circuits or static RAMs can be configured using an E/D mode inverter CMOS inverter.

Figure 16:
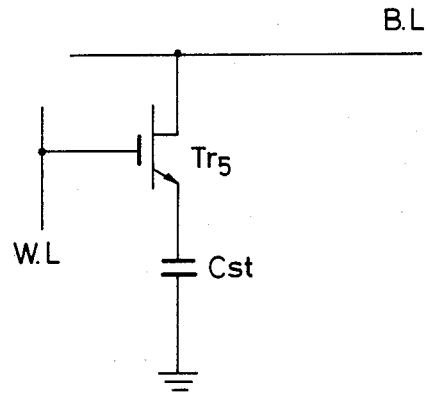
FIG. 16 shows a dynamic RAM employing a MOSSIT of the present invention.
Figure 17:
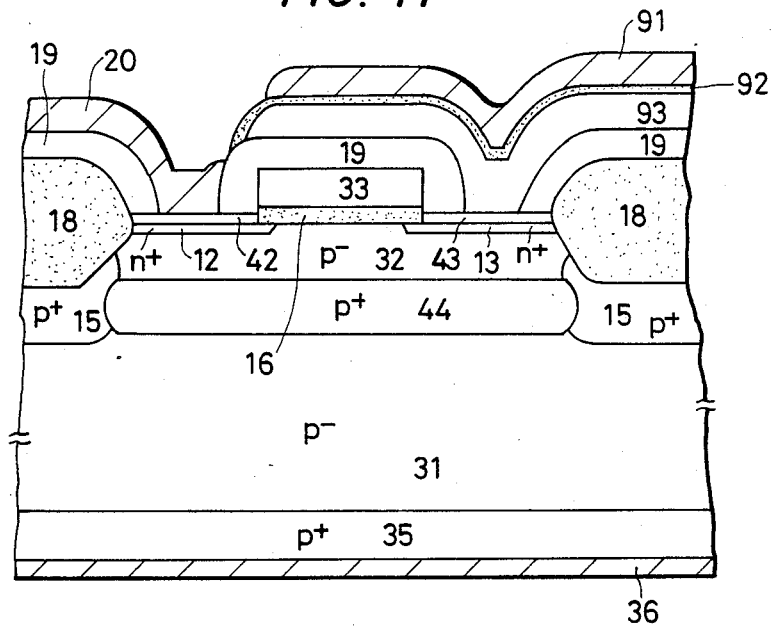
FIG. 17 is a cross-sectional view of an integrated implementation of the RAM of FIG. 17.

A dynamic RAM (dRAM) of the single-transistor, single-capacitor type using a MOSSIT of the present invention is shown in FIGS. 16 and 17. FIG. 16 is a circuit diagram of the dRAM, wherein Tr$_5$ is the MOSSIT, WL is a word line, BL is a bit line, and C$_{st}$ is a storage capacitance. WL and BL are connected to a decoder and a sense amplifier, respectively. FIG. 17 is a cross-sectional view of a dRAM implemented with the MOSSIT shown in FIG. 7. In this embodiment, the storage capacitance C$_{st}$ is formed with n+ polycrystalline silicon 93, a thin insulating layer 92 and a metal electrode 91. The device further includes a gate electrode 33 connected to the word line, an electrode 20 connected to the bit line, and an insulating layer 92 made of SiO$_2$, Si3N$_4$ or SiO$_x$N$_y$. With the device of FIG. 17, the channel length can be reduced to about $L_{eff}$=D when no bias is applied to the substrate. Thus, the device so constructed is very well suited for future VLSI memories having storage capacities of 1M bits or more. As discussed in Japanese Patent Application JPA56-32757 a dRAM having the above-discussed circuit configuration is adequately protected from "soft" errors due to irradiation by alpha rays.

The MOSSIT is a device having the following three features: (1) the channel area is formed of a low doping density, high-resistance region; (2) its normally off characteristic is provided by the boundary conditions determined by the diffusion potentials of the gate electrode and buried layer (for simplicity, the generic term "buried layer" is used to include the highly doped substrate); and (3) the charge carriers induced in the inversion lay are made to flow downwards to the deepest possible area.

Figure 18:
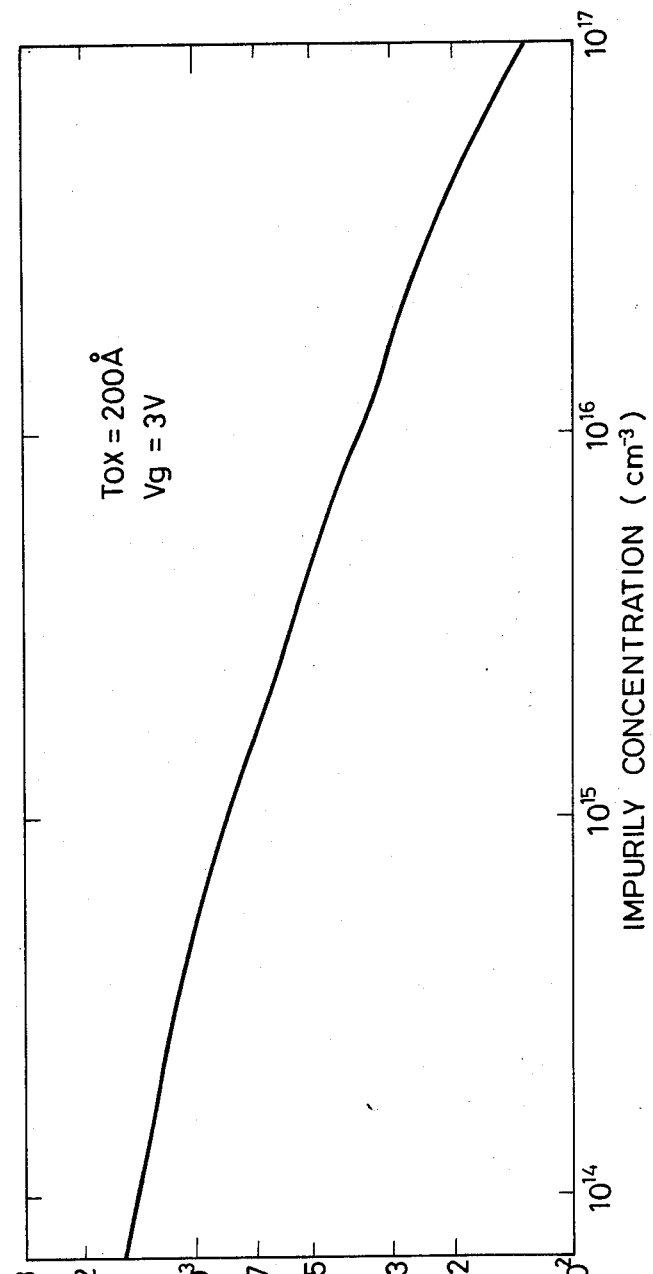
FIG. 18 is a graph showing the dependency on the impurity concentration of the depth of carriers distributed in an inversion layer.

The dependency of the channel impurity concentration on the depth of carriers distributed in the inversion layer is shown in FIG. 18 for $T_{ox}$=200 Å and V$_g$=3 V. The upper limit of the carrier concentration plotted in FIG. 18 is $1\times10^{17}$ cm$^{-3}$. As a matter of course, the depth of carrier distribution is increased as the impurity concentration of the channel is decreased. Such a MOSSIT is provided with a normally off characteristic not by elimination of a neutral region in the channel but by boundary conditions determined by the diffusion potentials of the gate and buried layer; if the former is smaller than a certain value the impurity concentration of the channel has no effect on the potential distribution in the channel (i.e. there is no change in the height of the barrier potential). In a region where D and L$_{eff}$ are not more than about 1 μm, the concentration and type of impurity have little effect on the potential distribution if the impurity concentration is about $5\times10^{14}$ cm$^{-3}$ or less. Therefore, in the complementary MOSSIT circuit of FIG. 15 wherein the channels of the n-channel and p-channel MOSSITs are formed in p⁻ and n⁻ regions, respectively, the operation of the circuit is practically independent of the type of the majority carrier in each high-resistivity region so long as it has an impurity concentration of about $1\times10^{14}$ cm$^{-3}$ or less. This independence contributes to simpler fabrication of the device because of fewer masking steps.

A short-channel MOSFET generally has a channel impurity concentration on the order of $1\times10^{16}$ cm$^{-3}$. As is clear from FIG. 18, the depth of carrier distribution for that concentration is not more than about 300 Å. On the other hand, both source and drain regions are usually formed to a depth of about 0.1 to 0.3 μm. Therefore, the highly doped source and drain regions generally extend deeper than the greatest depth of the charge carrier distributed in the inversion layer.

Two requirements must be met in order to fabricate a MOSSIT of the present invention. One is to provide an abrupt transition area between the highly doped buried layer and the high-resistivity channel region. This becomes more difficult to satisfy as $L_{eff}$ and D decrease. To form a high-resistivity channel layer using an epitaxial growth process, vacuum epitaxial growth can be combined with U.V. irradiation to lower the temperature of the semiconductor substrate during epitaxial growth and to suppress excessive self doping. (See M. Kumagawa, H. Sunami, T. Teraskaki and J. Nishizawa, "Epitaxial Growth with Light Irradiation", *Japn. J. Appl. Phys.*, vol. 7, pp. 1332–1341, 1968). To form a highly doped buried region by ion injection, the distribution of impurities that diffuse into the high-resistivity channel region during annealing may be compensated by injecting the correct amount of ions of an impurity having an opposite conductivity type.

The second requirement is to form shallow, highly doped (about $1 \times 10^{22}$ cm$^{-3}$) source and drain regions. In a conventional device using electrodes made of Al or Al-Si, the lower limit of the depth of a highly doped region is about 0.1 $\mu$m. However, a less deep region of high impurity concentration may be formed by the following method: A silicon substrate with a thin deposition of highly concentrated polycrystalline silicon is heated to several hundred degrees Celsius while it is irradiated with Ar laser light to heat only the very small interface between polycrystalline silicon and silicon so that the former diffuses into a very shallow area of the silicon surface. The thickness of the polycrystalline silicon layer can be determined by using laser light of a wavelength which will not penetrate deeply into the silicon. An alternative method is described in a paper presented by Hidekazu Okabayashi et al. of Nippon Electric Co., Ltd. at the meeting of Mar. 5, 1982 of the Study Group of Electronic Devices of The Institute of Electrical Engineers of Japan. According to this method, a Mo layer having a thickness of several tens of angstroms to several hundred angstroms is first deposited on the surface of a silicon substrate. Then, ions of As or B are injected in such a manner that they just penetrate through the Mo layer, reaching a depth of several tens of angstroms to several hundred angstroms below the surface. After effecting thorough silicon ion implantation until the very thin silicon layer just beneath the Mo film becomes substantially amorphous, the assembly is annealed at 600°–700° C. in an inert atmosphere, such as in nitrogen. Annealing causes the Mo to completely react with the amorphous silicon layer to form $MoSi_2$, which is highly uniform and is virtually a single crystal. Usually, the reaction to form a silicide causes a volume loss which leads to a tensile stress, but the silicide layer thus produced is so thin that no dislocations occur. The assembly is then annealed at a temperture between 900° and 1,000° C., whereupon a highly doped layer and an electrode are formed at the same time. Other metals may be used in place of Mo. Tungsten is best suited for use in a self-aligning process because it can be deposited by CVD (chemical vapor deposition) techniques and it builds up selectively on silicon or polycrystalline silicon but not on $SiO_2$ or $Si_3N_4$ insulating layers. After making contact holes, a PSG (phosphosilicate glass) film is caused to flow, but this usually requires considerably high temperatures and may be a barrier to the fabrication of a MOSSIT that uses a very thin, highly doped region. The PSG film must be heated to the softening point of PSG in order to cause it flow. A $CO_2$ laser beam has a wavelength of 9.3 $\mu$m and is absorbed by the PSG film, but not absorbed by silicon. (See M. Delfino et al.; Extended Abstracts on 161st Electrochemical Society Meeting, No. 89; and J. M. Hode, ibid., No. 90). Therefore, by using a $CO_2$ laser beam having a wavelength of 9.3 $\mu$m for heating the PSG film, only the glass will be made to flow and the temperature of the other elements of the MOSSIT being fabricated will not be heated excessively.

It goes without saying that a MOSSIT of the present invention is not limited to the embodiments described above. For instance, the conductivity types may be reversed from those described above. It is a requirement, however, that the gate electrode be composed of a polycrystalline layer, silicide layer, metal layer or a composite layer thereof having a conductivity type opposite that of the source region, and that it have a high diffusion potential with respect to the source region; (2) that a highly doped, buried layer be formed adjacent a highly resistive channel region; and (3) the source region be highly doped and formed as a very thin layer that does not exceed the depth of the distribution of carriers in the inversion layer. The drain resion, which should also be highly doped, may be formed as a thin layer in the same manner as the source region or as a thick layer that exceeds the depth of carrier distribution in the inversion layer.

In the device described above, a potential barrier is formed in a high-resistivity channel region at zero gate bias by providing the area directly beneath the gate and channel with a region having a higher diffusion potential than the highly doped source region. One method of forming a channel in a high-resistivity region having a very low impurity concentration is to form a source electrode on one side of a Schottky junction. This method is effective for keeping the carrier mobility high and causing the carriers to flow to the deepest possible region so as to achieve a higher transconductance. The potential barrier or diffusion potential on the metal side of the Schottky junction with respect to a semiconductor material is essentially determined by the material of the metal and the semiconductor. In addition, the exact position of the potential barrier is several tens of angstroms away from the junction into the semiconductor side. This means the potential barrier is only several tens of angstroms away from the position where the Schottky source electrode is held at a constant potential, and it is quite difficult to control the height of this potential barrier by the gate electrode.

The distance over which the gate electrode achieves potential control is only about several tens of angstroms. However, with a MOS transistor, the carriers generated directly beneath the gate insulating layer are only from several hundred angstroms to about 2000 Å deep. It does not matter a great deal if the depth of carrier injection from the Schottky source electrode is limited to less than 100 Å from the surface. The Schottky source MOS transistor is provided with a normally off characteristics by the Schottky junction, so that there is a fairly great latitude in designing other components. The drain electrode may be formed as either a highly doped region or a Schottky junction. The channel may have either conductivity type so long as it is formed in a high-resistivity region. Theoretically, an n-type region is better for an n-channel transistor. However, in order to insulate individual transistors, the electrodes of the transistor adjacent the channel must be formed in a p-type region of a relatively high impurity concentration. The channel of a Schottky source type MOS transistor can be shortened to such an extent that the drain voltage directly affects the front end of the source because no current will flow unless avalanche breakdown occurs or a tunnel current is allowed to flow. The gate electrode may be made of any material, and if the fabrication process permits, it may be made of a low-resistivity metal or silicide. The source electrode is sufficiently close to the position of the potential barrier that the space-charge effect of carriers stored in the gap is very small, and as a result, a transistor having a small resistance in the conducting state and which provides a large transconductance is obtained. As a further advantage, the transistor is less susceptible to the effect of "hot" electrons.

As already mentioned, the distance between the Schottky junction and the potential barrier is as small as several tens of angstroms, so that interface between metal and semiconductor should be smooth on an atomic scale. With a silicon device, a crystalline silicide such as PtSi, CoSi$_2$, Pd$_2$Si or NiSi$_2$ is preferably used. More preferably, these silicides may be used in monocrystalline form, if it is possible to perform the entire fabrication process at low temperatures. If not, the procedure described earlier may be followed, namely: deposit Mo, W, Ta, etc. on the surface of a silicon substrate to form a thin layer with a thickness of several tens of angstroms to several hundred angstroms; then, inject Si ions to form an amorphous Si surface; and thereafter, heat the assembly to start the reaction for the formation of silicide. In the foregoing embodiments, the individual elements of an MOSSIT are isolated by oxide layers formed by the conventional method of local oxidation of silicon (LOCOS). If "bird's beaks" become a barrier to a higher degree of integration of the elements, isolation regions not involving "bird's beaks" may be used. In the embodiments so far described, only silicon is used as a starting material, but the device may be formed of semiconductor materials such as GaAs and InP.

The MOSSIT of the present invention permits the use of a very short channel which can be reduced in length to several hundred angstroms without experiencing variations in the threshold voltage of the transistor due to injection of hot carriers and without malfunction in the event of alpha-ray radiation. The MOSSIT provides a large transconductance with a small capacitance, so that its drive power is sufficiently great to permit high-speed operation. In addition, the MOSSIT is reasonably immune to difficulties caused by variations in the fabrication process.

What is claimed is:

1. An insulated gate electrostatic induction transistor comprising:
    a semiconductor substrate;
    a high resistivity channel region;
    a highly doped source region formed adjacent said high resistivity channel region;
    a gate electrode disposed adjacent said high resistivity channel region with a thin insulating layer separating said gate electrode from a major surface of said channel region, said gate electrode being made of a material providing a high diffusion potential with respect to said source region, the depth of said highly doped source region being less than that of a distribution of carriers in an inversion layer formed under said gate electrode; and
    a drain region formed adjacent said high resistivity channel region; said source and drain regions being formed as relatively thin layers disposed out of contact with said semiconductor substrate, the depth of said source region being between approximately seventy and several hundred angstroms, and the length of said channel region being on the order of or less than 1.0$\mu$;
    and wherein the ratio of the length of said high resistivity channel region to a depth of said channel region is at least greater than 1.3.

2. The insulated gate electrostatic induction transistor of claim 1, wherein said gate electrode is made of a material selected from the group consisting of low-resistivity polycrystalline material, silicide, metal and a composite layer comprising a plurality of layers of any of said low-resistivity polycrystalline material, silicide and metal.

3. The insulated gate electrostatic induction transistor of claim 2, wherein said silicide is selected from the group consisting of MoSi$_2$, WSi$_2$, TaSi$_2$ and TiSi$_2$.

4. The insulated gate electrostatic induction transistor of claim 2, wherein said metal is selected from the group consisting of Mo, W, and Pt.

5. The insulated gate electrostatic induction transistor of claim 1, wherein said source region has a thickness of the order of several hundred angstroms or less.

6. The insulated gate electrostatic induction transistor of claim 1, wherein a depth of said high resistivity channel region is approximately equal to or smaller than an effective channel length of said channel region.

7. The insulated gate electrostatic induction transistor of claim 1, wherein a portion of said gate electrode in contact with said thin insulating layer is made of low-resistivity polycrystalline silicon of a conductivity type opposite a conductivity type of said source region.

8. The insulated gate electrostatic induction transistor of claim 1, further comprising a drain region disposed adjacent said channel region on a side thereof opposite said source region, said drain region having a depth approximately equal to said depth of said source region.

9. The insulated gate electrostatic induction transistor of any one of claims 1 to 8, further comprising a relatively highly doped region of a conductivity type opposite a conductivity type of said source region disposed adjacent at least a part of said high-resistivity channel region.

10. An integrated circuit comprising a drive circuit including an MOS transistor and an insulated gate electrostatic induction transistor having conductive channels coupled in series with one another, said insulated gate electrostatic induction transistor comprising:
    a semiconductor substrate;
    a high resistivity channel region;
    a highly doped source region formed adjacent said high resistivity channel region;
    a gate electrode disposed adjacent said high resistivity channel region with a thin insulating layer separating said gate electrode from a major surface of said channel region, said gate electrode being made of a material providing a high diffusion potential with respect to said source region, the depth of said highly doped source region being less than that of a distribution of carriers in an inversion layer formed under said gate electrode; and
    a drain region formed adjacent said high resistivity channel region; said source and drain regions being formed as relatively thin layers disposed out of contact with said semiconductor substrate, the depth of said source region being between approximately seventy and several hundred angstroms, and the length of said channel region being on the order of or less than 1.0μ;

and wherein the ratio of the length of said high resistivity channel region to a depth of said channel region is at least greater than 1.3.

11. The insulated gate electrostatic induction transistor of claim 10, wherein said gate electrode is made of a material selected from the group consisting of low-resistivity polycrystalline material, silicide, metal and a composite layer comprising a plurality of layers of any of said low-resistivity polycrystalline material, silicide and metal.

12. The insulated gate electrostatic induction transistor of claim 11, wherein said silicide is selected from the group consisting of $MoSi_2$ and $WSi_2$, $TaSi_2$ and $TiSi_2$.

13. The insulated gate electrostatic induction transistor of claim 11, wherein said metal is selected from the group consisting of Mo, W, Pt and Al.

14. The insulated gate electrostatic induction transistor of claim 10, wherein said source region has a thickness of the order of several hundred angstroms or less.

15. The insulated gate electrostatic induction transistor of claim 10, wherein a depth of said high resistivity channel region is approximately equal to or smaller than an effective channel length of said channel region.

16. The insulated gate electrostatic induction transistor of claim 10, wherein a portion of said gate electrode in contact with said thin insulating layer is made of low-resistivity polycrystalline silicone of a conductivity type opposite a conductivity type of said source region.

17. The insulated gate electrostatic induction transistor of claim 10, further comprising a drain region disposed adjacent said channel region on a side thereof opposite said source region, said drain region having a depth approximately equal to said depth of said source region.

18. The insulated gate electrostatic induction transistor of any one of claims 10 to 17, further comprising a relatively highly doped region of a conductivity type opposite a conductivity type of said source region disposed adjacent at least a part of said high-resistivity channel region.

19. An integrated circuit comprising a drive circuit including first and second insulated gate electrostatic induction transistors having conductive channels coupled in series with one another, each of said insulated gate electrostatic induction transistors having conductive channels coupled in series with one another, each of said insulated gate electrostatic induction transistors comprising:
  a semiconductor substrate;
  a high resistivity channel region, said first and second insulated gate electrostatic induction transistors having channel regions of opposite conductivity types;
  a highly doped source region formed adjacent said high resistivity channel region;
  a gate electrode disposed adjacent said high resistivity channel region with a thin insulating layer separating said gate electrode from a major surface of said channel region, said gate electrode being made of a material providing a high diffusion potential with respect to said source region, the depth of said highly doped source region being less than that of a distribution of carriers in an inversion layer formed under said gate electrode; and
  a drain region formed adjacent said high resistivity channel region; said source and drain regions being formed as relatively thin layers disposed out of contact with said semiconductor substrate, the depth of said source regions being between approximately seventy and several hundred angstroms, and the length of said channel region being on the order of or less than 1.0μ;

and wherein the ratio of the length of said high resistivity channel region to a depth of said channel region is at least greater than 1.3.

20. The insulated gate electrostatic induction transistor of claim 19, wherein said gate electrode is made of a material selected from the group consisting of low-resistivity polycrystalline material, silicide, metal and a composite layer comprising a plurality of layers of any of said low-resistivity polycrystalline material, silicide and metal.

21. The insulated gate electrostatic induction transistor of claim 20, wherein said silicide is selected from the group consisting of $MoSi_2$, WSi, $TaSi_2$ and $TiSi_2$.

22. The insulated gate electrostatic induction transistor of claim 20, wherein said metal is selected from the group consisting of Mo, W, Pt and Al.

23. The insulated gate electrostatic induction transistor of claim 19, wherein said source region has a thickness of the order of several hundred angstroms or less.

24. The insulated gate electrostatic induction transistor of claim 19, wherein a depth of said high-resistivity channel region is approximately equal to or smaller than an effective channel length of said channel region.

25. The insulated gate electrostatic induction transistor of claim 19, wherein a portion of said gate electrode in contact with said thin insulating layer is made of low-resistivity polycrystalline silicon of a conductivity type opposite a conductivity type of said source region.

26. The insulated gate electrostatic induction transistor of claim 19, further comprising a drain region disposed adjacent said channel region on a side thereof opposite said source region, said drain region having a depth approximately equal to said depth of said source region.

27. The insulated gate electrostatic induction transistor of any one of claims 19 to 26, further comprising a relatively highly doped region of a conductivity type opposite a conductivity type of said source region disposed adjacent at least a part of said high-resistivity channel region.

* * * * *